United States Patent
Nagasawa et al.

(10) Patent No.: US 10,004,170 B2
(45) Date of Patent: Jun. 19, 2018

(54) ELECTRONIC COMPONENT MOUNTER

(71) Applicant: Panasonic Intellectual Property Management Co., Ltd., Osaka (JP)

(72) Inventors: Yosuke Nagasawa, Yamanashi (JP); Dai Yokoyama, Yamanashi (JP); Hideaki Watanabe, Yamanashi (JP); Shigeki Imafuku, Yamanashi (JP); Jintao Huang, Singapore (SG)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 177 days.

(21) Appl. No.: 15/202,580

(22) Filed: Jul. 6, 2016

(65) Prior Publication Data

US 2017/0042073 A1    Feb. 9, 2017

(30) Foreign Application Priority Data

Aug. 5, 2015   (JP) .................................. 2015-154662

(51) Int. Cl.
  *B23P 19/00*    (2006.01)
  *H05K 13/04*    (2006.01)
(52) U.S. Cl.
  CPC ................. *H05K 13/0417* (2013.01)
(58) Field of Classification Search
  CPC ............................ H05K 13/0417; H05K 13/04
  See application file for complete search history.

(56) References Cited

U.S. PATENT DOCUMENTS

| | | | | |
|---|---|---|---|---|
| 4,610,083 A * | 9/1986 | Campisi | ............. | H05K 13/0417 156/751 |
| 6,626,222 B1 * | 9/2003 | VanNortwick | ..... | B65H 35/0013 156/261 |
| 6,694,606 B1 * | 2/2004 | Ohashi | ................ | H05K 13/003 226/128 |
| 6,817,216 B2 * | 11/2004 | Kou | ..................... | H05K 13/021 70/209 |
| 7,273,166 B2 * | 9/2007 | Suhara | ............... | H05K 13/0417 235/376 |
| 8,269,973 B2 * | 9/2012 | Kou | ....................... | B65H 26/02 356/445 |
| 9,271,417 B2 * | 2/2016 | Kawaguchi | .......... | H05K 13/021 |

(Continued)

FOREIGN PATENT DOCUMENTS

JP         2013-162102        8/2013

*Primary Examiner* — Paul D Kim
(74) *Attorney, Agent, or Firm* — Pearne & Gordon LLP

(57) ABSTRACT

There is provided an electronic component mounter configured to include a supplier holder in which a radial lead type electronic component supplier can be mounted, and to cause a mounting head to hold a radial lead type electronic component so as to mount the component on a board positioned by a board holder. The electronic component mounter includes a tape guide passage that guides a tape body after the radial lead type electronic components are picked up from the tape body. The electronic component supplier is configured to further include a posture converter that converts a posture of the tape body from a posture perpendicular to a horizontal plane to a posture parallel to the horizontal plane, after the radial lead type electronic components are picked up from the tape body, and that introduces the tape body to the tape guide passage.

7 Claims, 12 Drawing Sheets

(56) References Cited

U.S. PATENT DOCUMENTS

2015/0045938 A1\* 2/2015 Kawaguchi ........ H05K 13/0417
  700/122
2015/0083845 A1\* 3/2015 Kawaguchi ........ H05K 13/0417
  242/563

\* cited by examiner

1 ELECTRONIC COMPONENT MOUNTER
2 BOARD TRANSPORTER
3 BOARD
4A, 4B SUPPLIER HOLDER
4b TAPE GUIDE PASSAGE
5 TAPE FEEDER
6 RADIAL COMPONENT FEEDER
10A, 10B MOUNTING HEAD 15, 25   ELECTRONIC COMPONENT HOLDING TAPE

15a TAPE BODY
16 CHIP TYPE ELECTRONIC COMPONENT

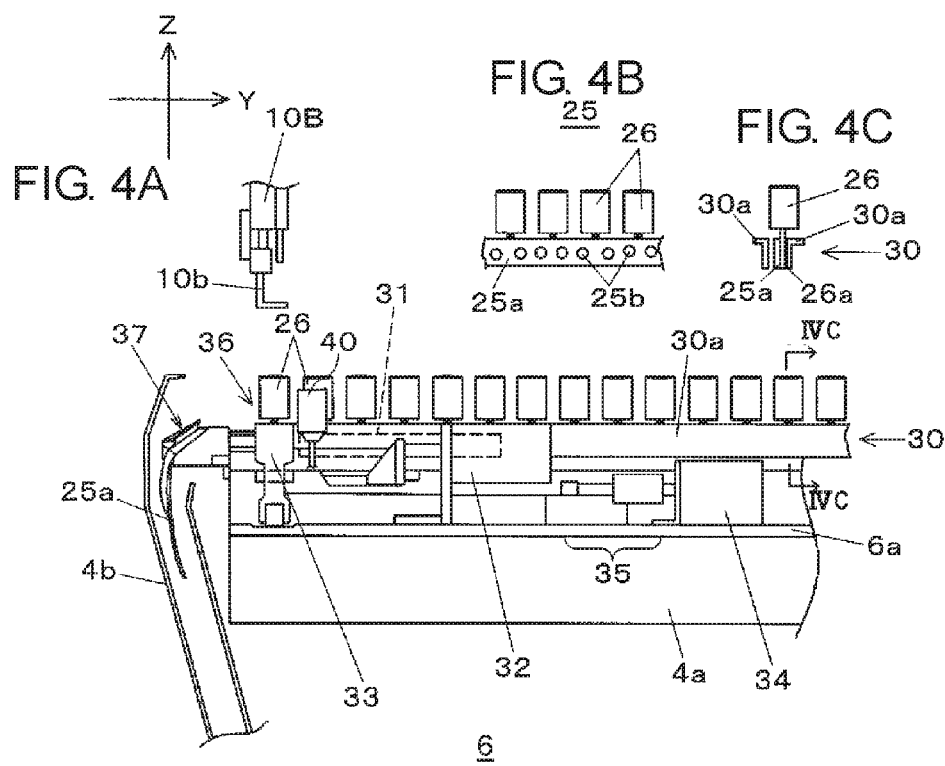

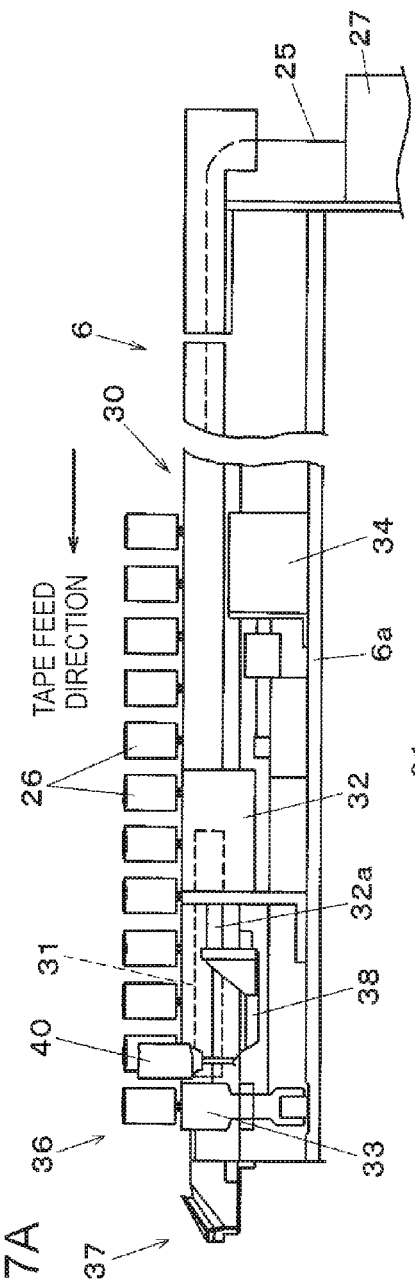
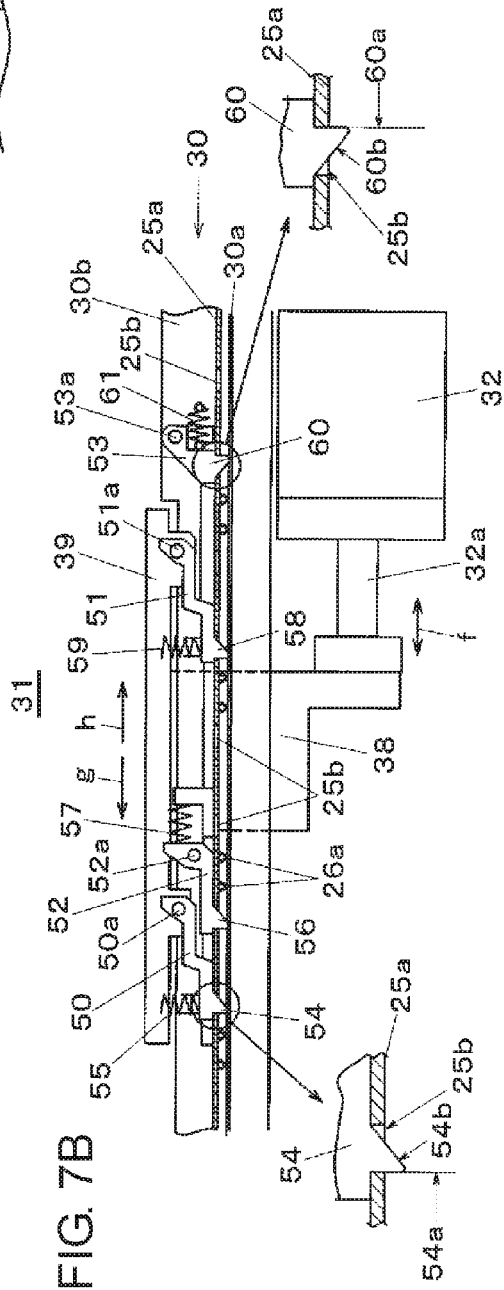

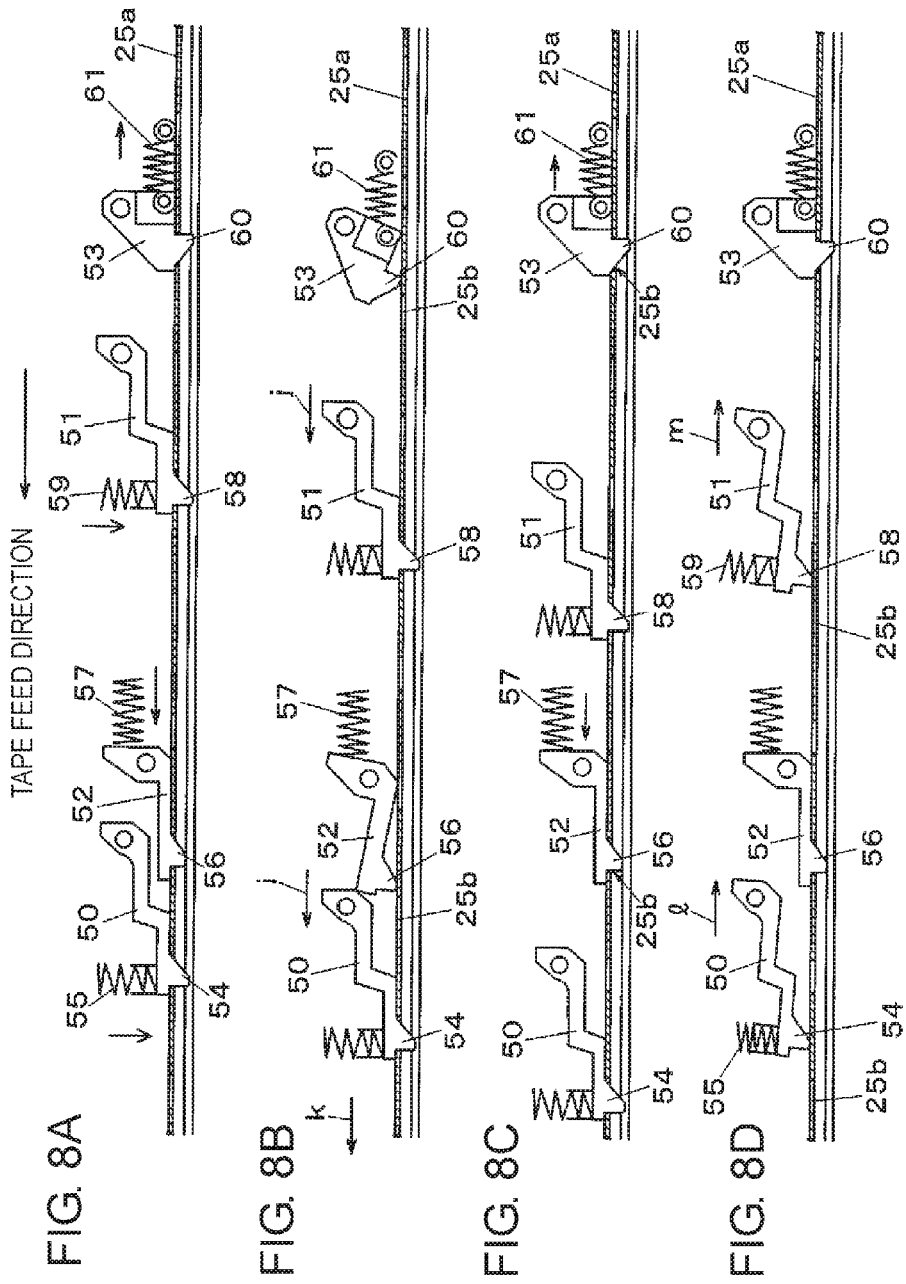

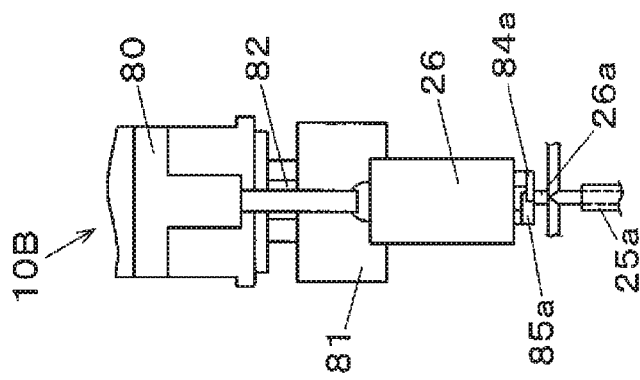
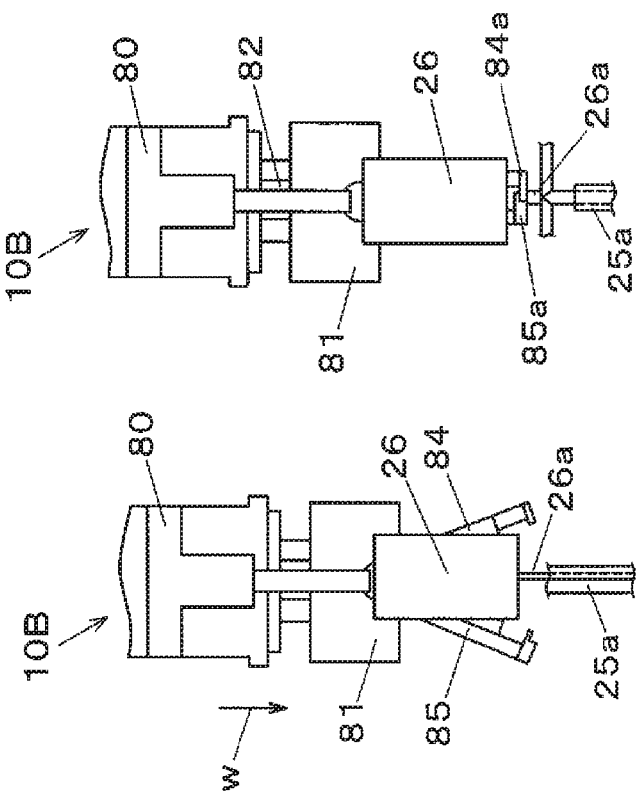
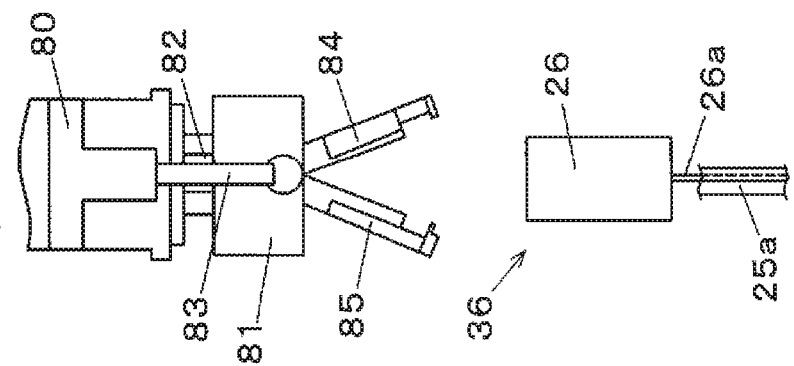

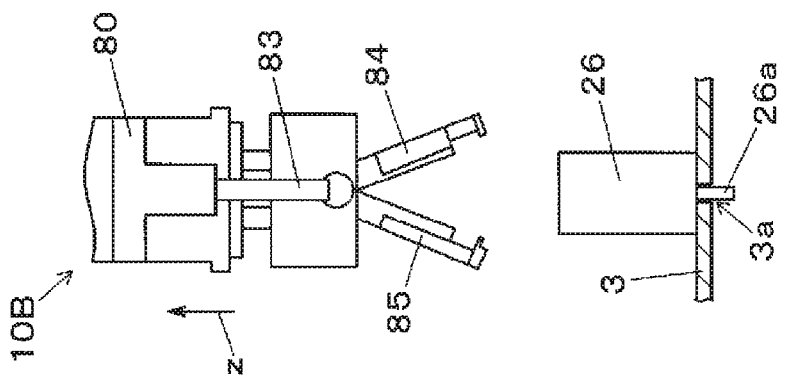
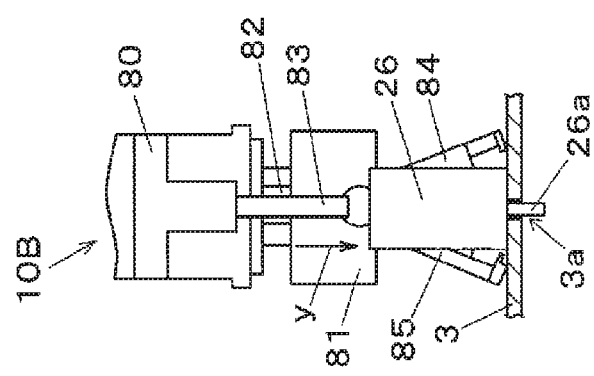
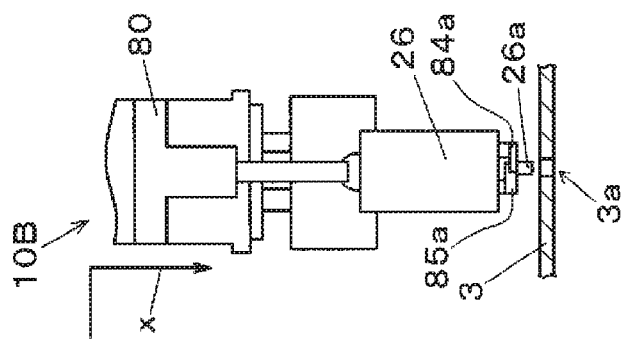

ELECTRONIC COMPONENT MOUNTER

BACKGROUND

1. Technical Field

The present disclosure relates to an electronic component mounter that mounts, on a board, an electronic component, including a radial lead type electronic component.

2. Description of the Related Art

In a component mounting line in which an electronic component is mounted on a board and a mounting board is manufactured, multiple types of electronic components, such as a surface-mounted component like a chip type component, which is attached on a circuit electrode surface of the board, or an insertion component which is mounted with a lead for connection being inserted into an insertion hole formed in the board, are mounted. In the related art, such components mounted by different mounting methods from each other are mounted by dedicated electronic component mounters, respectively; however, in recent years, according to a request for productivity improvement and equipment efficiency enhancement, there has been proposed an electronic component mounter in which a conventional type of tape feeder that supplies a chip type component or the like, and a tape feeder that supplies a radial lead type component can be installed together (for example, see Japanese Patent Unexamined Publication No. 2013-162102).

The prior art in Japanese Patent Unexamined Publication No. 2013-162102 discloses an example of an electronic component mounter including a radial lead type electronic component supplier in which an electronic component holding tape having a tape body that holds a plurality of radial lead type electronic components is loaded. The radial lead type electronic component supplier has functions of cutting a lead of a radial lead type electronic component held in the electronic component holding tape so as to have a predetermined length, and of causing a head body to supply the component to a holding position after separating the component from the tape body.

CITATION LIST

Patent Literature

Patent Literature 1: Japanese Patent Unexamined Publication No. 2013-162102

SUMMARY

An electronic component mounter of the present disclosure includes: a board transporter that transports a board and positions the board at a predetermined position; a supplier holder in which one or more electronic component suppliers that supply an electronic component can be installed; a radial lead type electronic component supplier which is installed in the supplier holder, in which an electronic component holding tape having a plurality of radial lead type electronic components and a tape body holding the plurality of radial lead type electronic components is loaded, and which supplies, in order, the radial lead type electronic components to a supply position; a mounting head that holds the radial lead type electronic component and mounts the component on the board positioned by the board transporter; and a tape guide passage that guides the tape body after the radial lead type electronic components are picked up from the tape body. The radial lead type electronic component supplier includes an attitude converter that converts an attitude of the tape body from an attitude perpendicular to a horizontal plane to an attitude parallel to the horizontal plane, after the radial lead type electronic components are picked up from the tape body, and that introduces the tape body to the tape guide passage.

According to the present disclosure, with the radial lead type electronic component as a mounting target, it is possible to dispose of the tape in a simple configuration after the electronic components are separated from the tape.

BRIEF DESCRIPTION OF THE DRAWINGS

FIG. 4A is an explanatory view of a configuration of a radial component feeder which is installed in the electronic component mounter of the embodiment of the present invention;

FIG. 4B is a side view illustrating a loaded electronic component holding tape in FIG. 4A;

FIG. 4C is a sectional view taken along line IVC-IVC in FIG. 4A;

FIG. 7A is an explanatory view of a configuration of a tape feed mechanism in the radial component feeder which is installed in the electronic component mounter of the embodiment of the present invention;

FIG. 7B is a view of a structure of a main part in FIG. 7A, viewed from above;

FIG. 8A is an explanatory view of an operation of the tape feed mechanism in the radial component feeder which is installed in the electronic component mounter of the embodiment of the present invention;

FIG. 8B is an explanatory view of an operation of the next state from the state in FIG. 8A;

FIG. 8C is an explanatory view of an operation of the next state from the state in FIG. 8B;

FIG. 8D is an explanatory view of an operation of the next state from the state in FIG. 8C;

FIG. 11A is an explanatory view of a mounting operation in which the radial lead type electronic component is picked up in the electronic component mounter of the embodiment of the present invention;

FIG. 11B is an explanatory view of an operation of the next state from the state in FIG. 11A;

FIG. 11C is an explanatory view of an operation of the next state from the state in FIG. 11B;

FIG. 12A is an explanatory view of a mounting operation in which the radial lead type electronic component is mounted in the electronic component mounter of the embodiment of the present invention;

FIG. 12B is an explanatory view of an operation of the next state from the state in FIG. 12A; and FIG. 12C is an explanatory view of an operation of the next state from the state in FIG. 12B.

DETAILED DESCRIPTION

Problems in a conventional device are briefly described before an embodiment of the present invention is described. In Japanese Patent Unexamined Publication No. 2013-162102 described above, the following problems arise in a disposal method of a tape body after radial lead type electronic components are separated from the tape body in a radial lead type electronic component supplier. In other words, the radial lead type electronic component supplier in the example described above is configured to include, as a tape feed mechanism that feeds the tape body, a two-direction tape feed mechanism in a tape feed direction as a component supply direction, and a return direction as a direction in which the tape body is collected after supplying a component. In addition, the radial lead type electronic component supplier is configured to cause the tape feed mechanism operating in the return direction, after direction conversion is performed, to transport and introduce the tape body, after the radial lead type electronic components are supplied to a holding position, and then are separated from the tape body, to the outside of the electronic component mounter. Therefore, a complicated structure and an increase in size of the radial lead type electronic component supplier are unavoidable and thus, it is desirable to achieve an electronic component mounter having a simple configuration in which it is possible to dispose of the tape, after the separation of the electronic components from the tape.

Hence, an object of the present disclosure is to provide an electronic component mounter that mounts the radial lead type electronic component as a mounting target and has a simple configuration in which it is possible to dispose of the tape after the separation of the electronic components from the tape.

Figure 1:
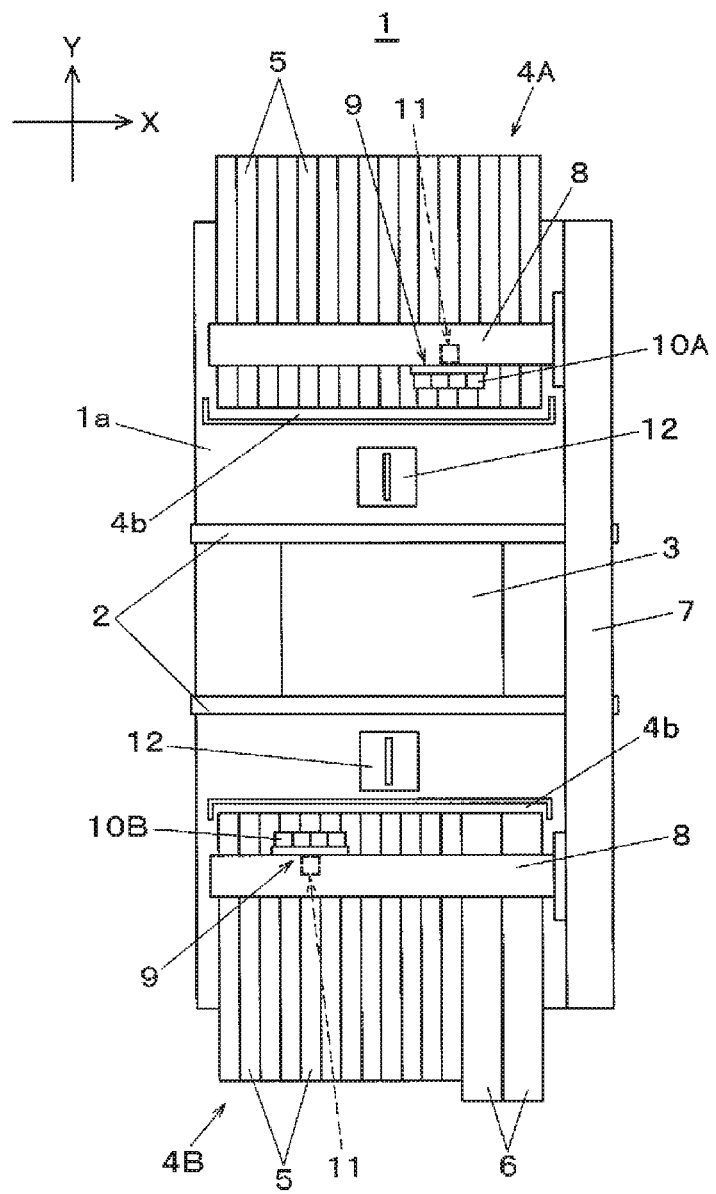
FIG. 1 is a plan view of an electronic component mounter of an embodiment of the present invention.

Next, an embodiment of the present invention will be described with reference to the drawings. First, with reference to FIGS. 1 and 2, a structure of electronic component mounter 1 is described. In FIG. 1, board transporter 2 is disposed on the top surface of base table 1a in an X direction (board transport direction). Board transporter 2 transports board 3 of a mounted target and positions the board at a mounting operation position as a predetermined position. Supplier holders 4A and 4B are disposed on both sides of board transporter 2, respectively.

Figure 2:
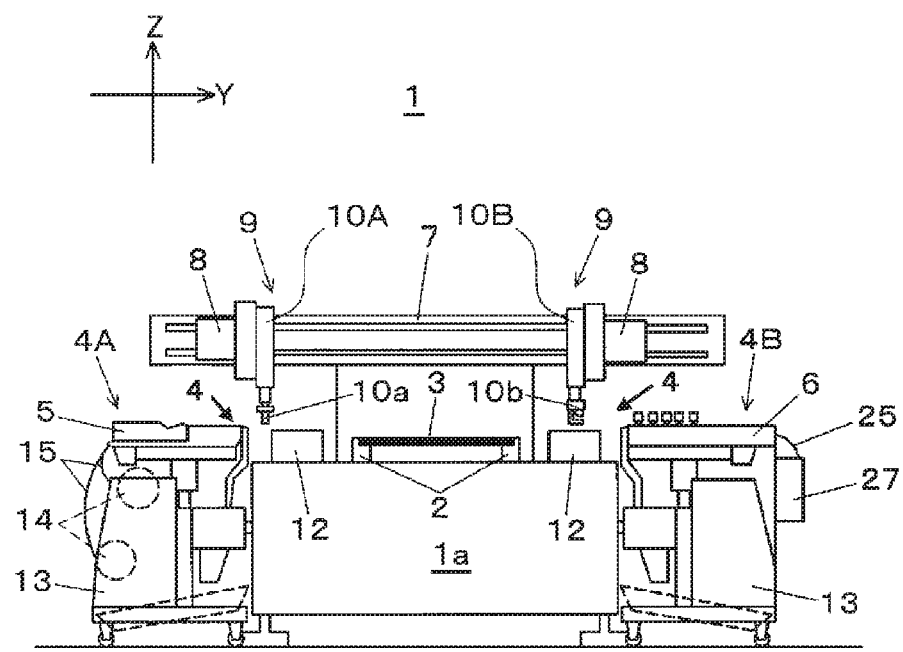
FIG. 2 is a sectional view of the electronic component mounter of the embodiment of the present invention.
Figure 3B:
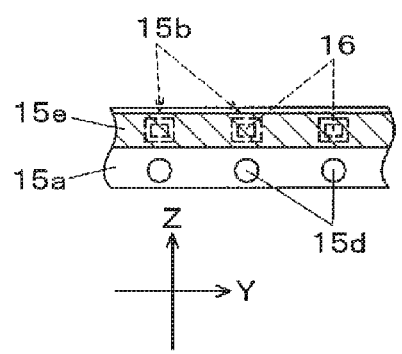
FIG. 3B is a plan view illustrating a loaded electronic component holding tape in FIG. 3A.
Figure 3C:
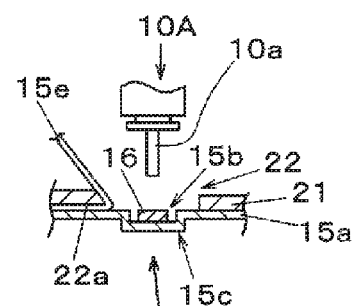
FIG. 3C is an enlarged view of the vicinity of a suction opening in FIG. 3A.

As illustrated in FIG. 2, carriage 13 is disposed in supplier holder 4A, and a plurality of tape feeders 5 as chip type electronic component suppliers are installed in parallel on the carriage 13. In addition, carriage 13 is disposed in supplier holder 4B, and a plurality of (here, two) (refer to FIG. 1) radial component feeders 6 as radial lead type electronic component suppliers are installed in parallel together with the plurality of tape feeders 5 on the carriage 13. In other words, a plurality of electronic component suppliers (tape feeder 5 and radial component feeder 6) which supply chip type electronic components 16 (refer to FIGS. 3A, 3B, and 3C) or radial lead type electronic components 26 (refer to FIGS. 4A, 4B, and 4C) can be installed in supplier holders 4A and 4B.

Tape feeder 5 has a function of supplying chip type electronic component 16 as a mounting target to a position at which mounting head 10A picks up the component. In other words, supply reel 14, in which electronic component holding tape 15 holding chip type electronic components 16 as mounting targets is wound and accommodated, is set in carriage 13. Electronic component holding tape 15 pulled out from supply reel 14 is loaded on tape feeder 5 and electronic component holding tape 15 is fed by pitch in tape feeder 5, thereby supplying, in order, chip type electronic components 16 held in electronic component holding tape 15 to a supply position. In other words, tape feeder 5 as the chip type electronic component supplier is installed in supplier holder 4A, electronic component holding tape 15 having the plurality of chip type electronic components 16 and tape body 15a (refer to FIGS. 3A, 3B, and 3C) holding chip type electronic components 16 is loaded on the tape feeder 5, and then, the tape feeder 5 supplies chip type electronic components 16 to the supply position in order.

Radial component feeder 6 has a function of supplying radial lead type electronic component 26 as a mounting target to a position at which mounting head 10B picks up the component. In other words, carriage 13 is accompanied by tape accommodation 27, in which electronic component holding tape 25 holding the radial lead type electronic components as the mounting targets is accommodated. Electronic component holding tape 25 pulled out from tape accommodation 27 is loaded on radial component feeder 6 and electronic component holding tape 25 is fed by pitch in radial component feeder 6, thereby supplying radial lead type electronic components 26 held in electronic component holding tape 25. In other words, radial component feeder 6 as the radial lead type electronic component supplier is installed in supplier holder 4B, electronic component holding tape 25 having the plurality of radial lead type electronic components 26 and tape body 25a (refer to FIGS. 4A, 4B, and 4C) holding radial lead type electronic components 26 is loaded on the radial component feeder 6, and then, the radial component feeder 6 supplies radial lead type electronic components 26 to the supply position in order.

Y-axis beam 7 driven by a linear motor is disposed in a Y direction on one end portion of base table 1a in the X direction, and two X-axis beams 8 are joined to Y-axis beam 7 so as to move freely in the Y direction. Head units 9 are installed on the X-axis beams 8, respectively, so as to move freely in the X direction when driven by a linear drive mechanism. Head unit 9 is a multi-connection type head including one of or both mounting heads 10A and 10B. Suction nozzle 10a that sucks and holds chip type electronic component 16 is installed on a lower end portion of mounting head 10A so as to be freely replaceable. Chuck unit 10b that holds radial lead type electronic component 26 by chucking is installed on a lower end portion of mounting head 10B so as to be freely replaceable.

The driving of Y-axis beam 7 and X-axis beam 8 allows head unit 9 to move horizontally between each of supplier holders 4A and 4B and board 3 held in board transporter 2, mounting heads 10A and 10B hold and pick up chip type electronic component 16 or radial lead type electronic component 26, and the component is mounted on board 3 positioned in board transporter 2. Board recognizing camera 11, which is positioned on the under surface side of X-axis beam 8 and moves integrally with head unit 9, is provided in each head unit 9. Board recognizing camera 11 moves, integrally with head unit 9, above board 3, and board 3 is imaged by board recognizing camera 11, thereby recognizing a position of board 3.

Component recognizing cameras 12 are disposed between supplier holders 4A, 4B and board transporters 2, respectively. Head unit 9 holding chip type electronic component 16 or radial lead type electronic component 26 moves above component recognizing camera 12, component recognizing camera 12 images chip type electronic component 16 or radial lead type electronic component 26, and an imaged result is subjected to recognition process, thereby performing identification or positional recognition of chip type electronic component 16 or radial lead type electronic component 26 in a state of being held in head unit 9.

Common tape guide passage 4b is disposed in a front edge portion on a component picking-up side of tape feeder 5 and radial component feeder 6 in supplier holders 4A and 4B, along the entire widths of supplier holders 4A and 4B. Tape guide passage 4b has a function of introducing empty tape bodies 15a and 25a (refer to FIGS. 3A and 4A) after the electronic components are picked up from the tape bodies.

Figure 3A:
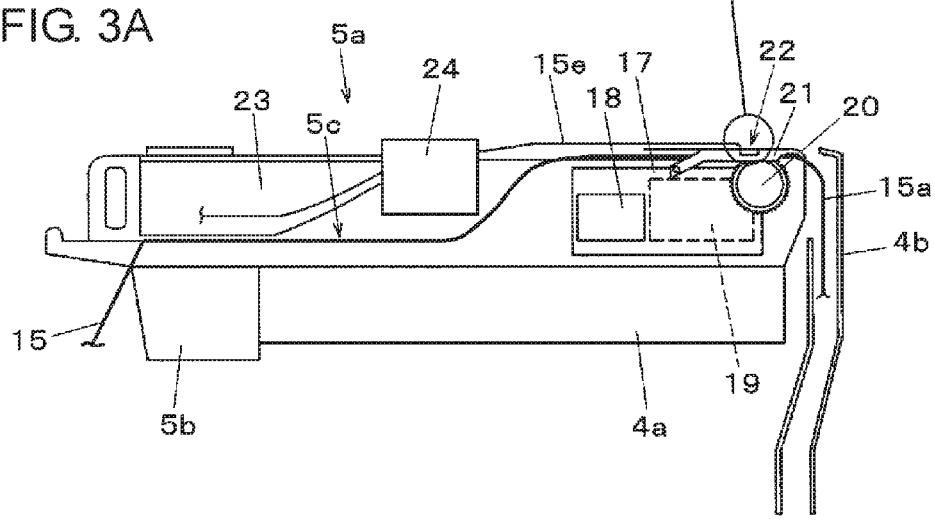
FIG. 3A is an explanatory view of a configuration of a tape feeder which is installed in the electronic component mounter of the embodiment of the present invention.

Next, configurations and functions of tape feeder 5 will be described with reference to FIG. 3A. As illustrated in FIG. 3A, tape feeder 5 is configured to have feeder body portion 5a forming the entire shape of corresponding tape feeder 5 and installing portion 5b projecting downward from the under surface of feeder body portion 5a. The under surface of feeder body portion 5a is placed along feeder installing base 4a and installing portion 5b is fitted into feeder installing base 4a, and thereby tape feeder 5 is fixed to and installed in component supply portion 4.

Tape traveling path 5c opened to an upstream end portion in the tape feed direction of feeder body portion 5a is provided inside feeder body portion 5a so as to communicate with a component suction position by mounting head 10A. Tape traveling path 5c has a function of guiding the tape feeding of electronic component holding tape 15 pulled out from supply reel 14 and introduced into feeder body portion 5a, from the upstream side of feeder body portion 5a to the component suction position by mounting head 10A.

Electronic component holding tape 15 has a configuration in which component pockets 15b for accommodating and holding chip type electronic components 16 in tape body 15a and sprocket holes 15d for feeding electronic component holding tape 15 by pitch are provided at predetermined pitches. A position corresponding to component pocket 15b in the under surface of tape body 15a is set as embossed portion 15c protruding downward. Component pocket 15b in the top surface of tape body 15a is covered and sealed by top tape 15e in order to prevent chip type electronic components 16 from dropping out from component pocket 15b.

Feeder body portion 5a includes built-in tape feeding portion 17 for feeding electronic component holding tape 15 by pitch. Tape feeding portion 17 includes sprocket 20, drive mechanism 19 that rotates and drives sprocket 20, and feeder controller 18 that controls drive mechanism 19. Drive mechanism 19 is driven in a state in which sprocket pins provided on the outer circumference of sprocket 20 engage with sprocket holes 15d of electronic component holding tape 15, thereby, feeding electronic component holding tape 15 along tape traveling path 5c by pitch (refer to FIG. 3B).

The front side of sprocket 20 is set to be a component suction position at which suction nozzle 10a of mounting head 10A sucks and picks up chip type electronic component 16 in component pocket 15b. Retaining member 21 is disposed on the top surface side of feeder body portion 5a in the vicinity of sprocket 20 and suction opening 22 is provided in retaining member 21 so as to correspond to the component suction position by suction nozzle 10a. The upstream end of suction opening 22 is set to be top tape peeler 22a for peeling off top tape 15e (refer to FIG. 3C).

In a process in which electronic component holding tape 15 travels below retaining member 21, top tape 15e is peeled off from tape body 15a at a tape peeling position on the upstream side of the component suction position by causing top tape 15e to move in a circle around top tape peeler 22a and to be pulled out to the upstream side and the top tape is folded back to the upstream side. Folded top tape 15e is fed into tape collector 23 by top tape feed mechanism 24. In this manner, chip type electronic component 16 in component pocket 15b is exposed upward through suction opening 22 and is in a state in which the component can be picked up by suction nozzle 10a. Then, after chip type electronic components 16 are picked up from the tape body 15a, empty tape body 15a is discharged toward the front side via the under surface side of retaining member 21, and is guided downward through tape guide passage 4b disposed on a front edge side of tape feeder 5 (also refer to FIG. 6).

Next, configurations and functions of radial component feeder 6 will be described with reference to FIG. 4A. As illustrated in FIG. 4A, radial component feeder 6 is configured to have various functional portions disposed in feeder body portion 6a as a frame forming the entire shape and, similar to tape feeder 5, is configured to have an installing portion (not illustrated) projecting downward from feeder body portion 6a. The under surface of feeder body portion 6a is placed along feeder installing base 4a and the installing portion is fitted into feeder installing base 4a, and thereby radial component feeder 6 is fixed to and installed in supplier holder 4B. Here, tape feeder 5 and radial component feeder 6 have installing compatibility with each other and it is possible to install radial component feeder 6 at any position of supplier holders 4A and 4B.

Radial lead type electronic components 26 as the mounting targets has leads 26a extending in a radial direction, and leads 26a of the plurality of radial lead type electronic components 26 are subjected to taping by tape body 25a in an arrangement state, thereby being supplied in a shape of electronic component holding tape 25 as a series of taping components. In other words, electronic component holding tape 25 is in a state of having the plurality of radial lead type electronic components 26 and tape body 25a holding the plurality of radial lead type electronic components 26. Also, feed holes 25b are formed in tape body 25a at a constant pitch so as to be used when tape feeding is performed by tape feed mechanism 31 to be described below (refer to FIG. 4B).

Tape transporter 30 that pulls out electronic component holding tape 25 accommodated in tape accommodation 27 (refer to FIGS. 2 and 7A) and transports the tape in the tape feed direction, is provided in feeder body portion 6a. As illustrated in a sectional view in FIG. 4C, tape transporter 30 is configured to transport radial lead type electronic components 26 that are in an upright-posture state on the top surface side by holding tape body 25a in a gap between a pair of vertical guide members 30a. The tape feeding in tape transporter 30 is performed by driving tape feed mechanism 31 (refer to FIGS. 7A, 7B, and 8A) provided in tape transporter 30 by tape-feed driving cylinder 32 disposed in feeder body portion 6a.

Supply position 36, at which chuck unit 10b of mounting head 10B holds and picks up radial lead type electronic component 26, is set on a front edge portion of tape transporter 30. Radial lead type electronic component 26 reaching supply position 36 is detected by component detecting sensor 40. Lead cutting mechanism 33, which cuts lead 26a of radial lead type electronic component 26 transported by tape transporter 30 and reaching supply position 36, is disposed at supply position 36. Lead cutting mechanism 33 is driven by lead cutting cylinder 34 through drive transmitting mechanism 35 disposed in feeder body portion 6a.

Lead cutting mechanism 33 pinches and cuts lead 26a of radial lead type electronic component 26 that reaches supply position 36 and is held by mounting head 10B, and radial lead type electronic component 26 is separated from the tape body 25a. Then, after radial lead type electronic components 26 are picked up from the tape body 25a, tape body 25a is guided downward by tape guide passage 4b after an posture of the tape body 25a is converted from a vertical posture to a horizontal posture by posture converter 37 provided on a front edge portion of radial component feeder 6 and on the tape guide passage 4b side from supply position 36.

Figure 5A:
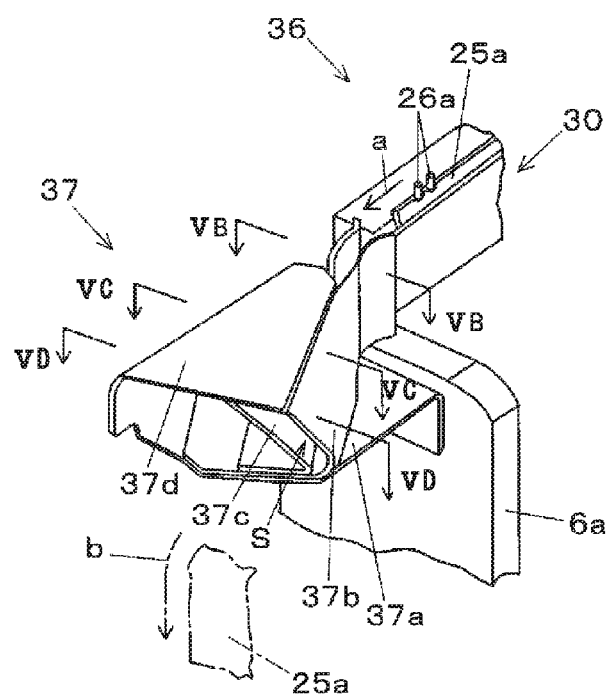
FIG. 5A is an explanatory view of a configuration of an attitude converter in the radial component feeder which is installed in the electronic component mounter of the embodiment of the present invention.

Next, configurations and functions of posture converter 37 will be described with reference to FIGS. 5A, 5B, 5C, and 5D. As illustrated in FIG. 5A, posture converter 37 is configured of combining a plurality of pieces of sheet metal subjected to bending work. In other words, posture converter 37 is configured to have first side member 37b and second side member 37c, both of which have a bent surface shape and are disposed on the top surface of base member 37a fixed to the front surface of feeder body portion 6a and extending in the horizontal direction, and further to have an apex surface 37d formed by bending and extension of a tip portion of base member 37a, and the apex surface 37d covers the top surfaces of first side member 37b and second side member 37c. In the configuration, a space enclosed by apex surface 37d on the top side, and first side member 37b and second side member 37c on both side surfaces becomes guide gap S in which the posture of tape body 25a is converted after tape body 25a is transported by tape transporter 30 and reaches supply position 36, and lead 26a is cut.

Figure 5B:
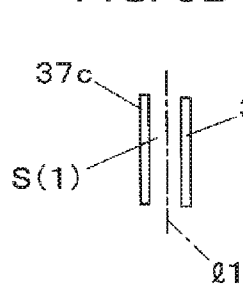
FIG. 5B is a sectional view taken along line VB-VB in FIG. 5A.
Figure 5C:
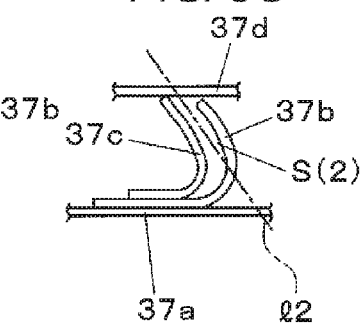
FIG. 5C is a sectional view taken along line VC-VC in FIG. 5A.
Figure 5D:
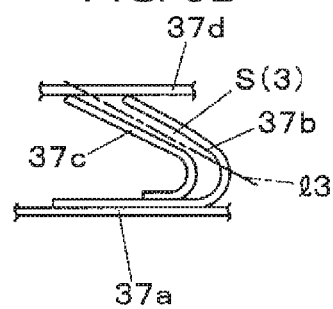
FIG. 5D is a sectional view taken along line VD-VD in FIG. 5A.

FIGS. 5B to 5D illustrate sectional views taken along lines VB-VB, VC-VC, and VD-VD in FIG. 5A, respectively. In FIG. 5B, without covering the top side of first side member 37b and second side member 37c having the vertical posture, first guide gap S(1) having a vertical gap center line 11 is formed between first side member 37b and second side member 37c. In addition, in FIG. 5C illustrating the sectional view taken along line VC-VC positioned on the front side from the sectional view taken along line VB-VB, first side member 37b and second side member 37c have a slightly inclined posture, the top side thereof is covered with apex surface 37d, and the space enclosed by apex surface 37d, first side member 37b, and second side member 37c forms second guide gap S(2) having a slightly inclined gap center line 12. Also, in FIG. 5D illustrating the sectional view taken along line VD-VD positioned on the front side from the sectional view taken along line VC-VC, first side member 37b and second side member 37c have a further inclined posture and the space enclosed by apex surface 37d, first side member 37b, and second side member 37c forms third guide gap S(3) having a gap center line 13 inclined to have an posture close to the horizontal surface.

After radial lead type electronic components 26 are picked up at supply position 36 (refer to FIG. 4A), tape body 25a is fed (arrow a), with a vertical posture, from the front edge portion of tape transporter 30 to posture converter 37, and is fed into guide gap S illustrated in FIG. 5A. Then, in a process of the tape feeding, the posture of tape body 25a is converted by a change in a shape of guide gaps S (first guide gap S(1), second guide gap S(2), and third guide gap S(3)), and, when the tape body 25a is fed (arrow b) from posture converter 37 to tape guide passage 4b (refer to FIGS. 4A and 6), the tape body 25a is guided downward to tape guide passage 4b after the posture is converted into the horizontal posture. In other words, radial component feeder 6 is configured to include posture converter 37 that converts the posture of tape body 25a from an posture perpendicular to the horizontal surface to an posture parallel to the horizontal surface after radial lead type electronic components 26 are picked up from the tape body 25a, and that guides the tape body 25a to tape guide passage 4b.

Figure 6:
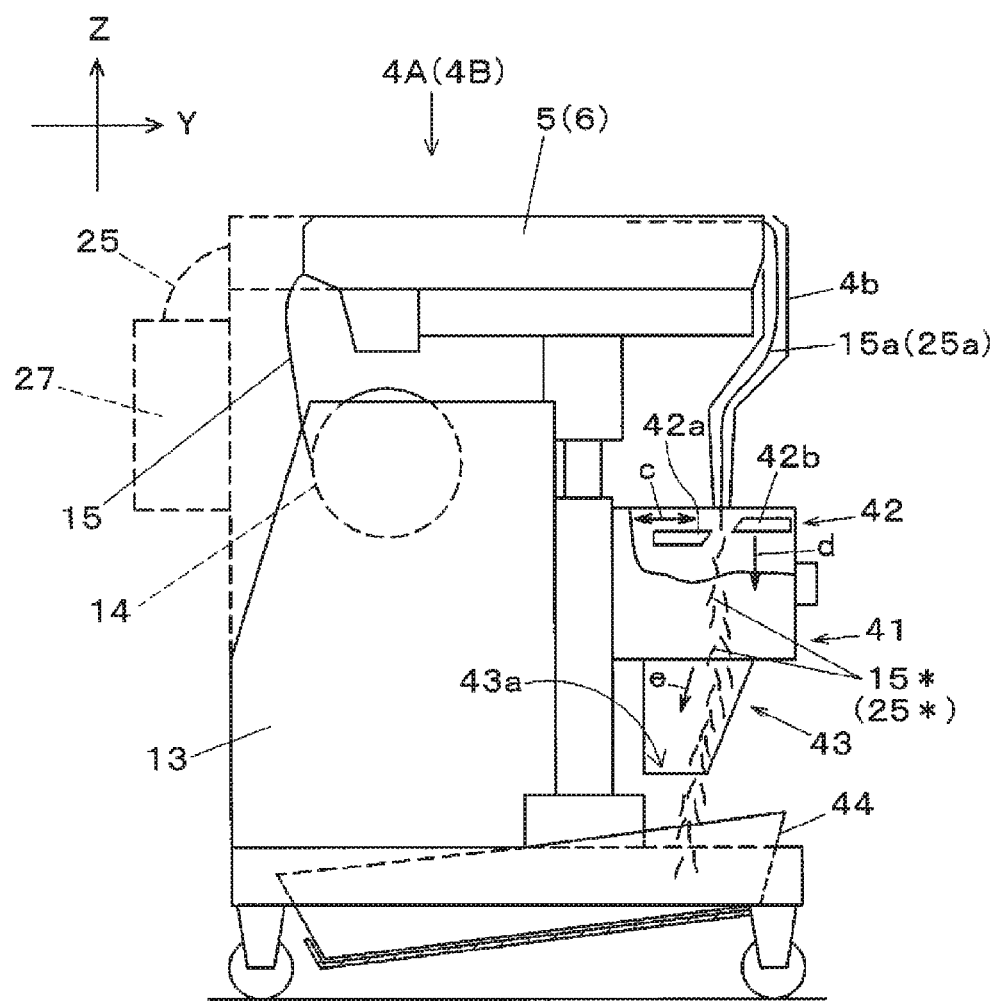
FIG. 6 is an explanatory view of a configuration of a tape cutter included in a supplier holder in the electronic component mounter of the embodiment of the present invention.

Next, configurations and functions of tape cutters 41 included in supplier holders 4A and 4B will be described with reference to FIG. 6. FIG. 6 shows, in a solid line, tape feeder 5 installed in supplier holder 4A and, in a dash line, radial component feeder 6 installed in supplier holder 4B. Electronic component holding tape 15 pulled out from supply reel 14 is loaded in tape feeder 5, and tape body 15a is guided downward by tape guide passage 4b after the tape body 15a is fed into tape feeder 5 by pitch and chip type electronic components 16 are picked up from the tape body 15a at the component suction position. In addition, electronic component holding tape 25 pulled out from tape accommodation 27 is loaded in radial component feeder 6, and, similarly, tape body 25a is guided downward by tape guide passage 4b after the tape body 25a is transported into radial component feeder 6 and radial lead type electronic components 26 are picked up from the tape body 25a at supply position 36. Also, in this manner, tape body 15a and tape body 25a which are guided downward, are guided to tape cutter 41 disposed below.

Tape cutter 41 has a function of cutting tape body 15a and tape body 25a which are discharged from tape feeder 5 and radial component feeder 6 such that the tape bodies have a short dimension. In other words, tape cutter 41 includes a cutting mechanism 42 configured to have movable blade 42a and fixed blade 42b and to cause movable blade 42a to reciprocate (arrow c) with respect to fixed blade 42b in the horizontal direction, and tape body 15a and tape body 25a, which are guided into tape cutter 41 by tape guide passage 4b, are cut into small pieces of tape scraps 15* and 25* by cutting mechanism 42 and fall down (arrow e).

Tape discharge duct 43 as a duct-shaped member provided to be opened on an under surface side communicates with the under surface of tape cutter 41. Tape discharge duct 43 has a function of discharging cut tape scraps 15* and 25* downward. Tape scraps 15* and 25* falling inside tape cutter 41 move downward, fall down from discharge opening 43a, and then, fall and are collected inside tape discharge box 44 having a box shape which is opened on the top side.

Here, as illustrated in FIG. 1, in electronic component mounter 1 according to the present embodiment, tape cutter 41 included in supplier holder 4B, in which tape feeder 5 and radial component feeder 6 are installed together, collectively cuts tape body 25a holding radial lead type electronic components 26 guided into tape guide passage 4b and tape body 15a holding chip type electronic components 16 similarly guided into tape guide passage 4b. In this manner, it is possible to use an empty tape disposal function which is included in equipment in the related art, in which chip type electronic component 16 is the mounting target, and to dispose of tape body 25a discharged from radial component feeder 6 in which radial lead type electronic component 26 is the mounting target. Thus, it is possible to dispose of tape in a simple configuration without occupying excessive space, after the separation of the electronic components, compared to the related art in which a dedicated tape returning mechanism for the radial lead type electronic components is required.

Next, configurations of tape feed mechanism 31 provided in tape transporter 30 will be described with reference to FIGS. 7A and 7B. In FIG. 7A, connection member 38 is joined to rod 32a of tape-feed driving cylinder 32. Connection member 38 extends to the opposite side (the rear surface side of the surface illustrated in FIG. 7A) below tape transporter 30, and moving member 39 illustrated in FIG. 7B is connected to connection member 38. Tape-feed driving cylinder 32 is driven such that rod 32a projects and retreats (arrow f), and thereby, moving member 39 moves in the tape feed direction (arrow g) and in the returning direction (arrow h). Also, reciprocating of moving member 39 allows tape feed mechanism 31 to be pulled out from tape accommodation 27 such that electronic component holding tape 25 loaded in radial component feeder 6 to be fed by pitch toward supply position 36 in tape feed direction.

FIG. 7B is a view of a structure of main parts in FIG. 7A, viewed from above. As illustrated in FIG. 7B, first feed member 50 and second feed member 51 having first feed claw 54 and second feed claw 58, which both engage with feed holes 25b of tape body 25a, are disposed in moving member 39 so as to pivot freely around pivots 50a and 51a, respectively. Positions of first feed member 50 and second feed member 51 are separated by four pitches of feed holes 25b by which first feed claw 54 and second feed claw 58 are separated. Here, first feed claw 54 and second feed claw 58 are biased in a direction in which the first feed claw and second feed claw engage with feed holes 25b by first spring member 55 and second spring member 59 as compression springs, respectively.

Here, first feed claw 54 has a shape formed by first surface 54a in a direction orthogonal to the front surface of tape body 25a, in the tape feed direction (arrow g), and second surface 54b having an obtuse angle with respect to the front surface of tape body 25a, in the returning direction (arrow h). Second feed claw 58 has the same shape as first feed claw 54. When to cause moving member 39 to move in the tape feed direction (arrow g), first feed claw 54 and second feed claw 58 have such a shape and thereby, it is possible to cause tape body 25a to move in the tape feed direction (arrow g) by first feed claw 54 and second feed claw 58 which engage with feed holes 25b. Also, When to cause moving member 39 to move in the returning direction (arrow h), in a state in which the position of tape body 25a is fixed, first feed claw 54 and second feed claw 58 are separated from feed holes 25b against bias forces of first spring member 55 and second spring member 59, thereby not interfering with a returning operation of moving member 39.

First fixation member 52 and second fixation member 53 having first fixation claw 56 and second fixation claw 60 which engage with feed holes 25b of tape body 25a are disposed in fixation portion 30b in tape transporter 30 so as to pivot freely around pivots 52a and 53a, respectively. First fixation member 52 is positioned on the side in the returning direction by one pitch of feed holes 25b from first feed claw 54, and first fixation claw 56 is biased in a direction in which the first fixation claw engages with feed hole 25b by third spring member 57 as a compression spring. Here, first fixation claw 56 has the same shape as first feed claw 54 in first feed member 50.

Second fixation member 53 is positioned on the side in the returning direction by two pitches of feed holes 25b from second feed claw 58, and second fixation claw 60 is biased in a direction in which the second fixation claw engages with feed hole 25b by fourth spring member 61 as a tension spring. Here, second fixation claw 60 has a shape formed by first surface 60a in a direction orthogonal to the front surface of tape body 25a, in the returning direction (arrow h), and second surface 60b having an obtuse angle with respect to the front surface of tape body 25a, in the tape feed direction (arrow g). First fixation claw 56 and second fixation claw 60 have such a shape and thereby, in a state in which both first fixation claw 56 and second fixation claw 60 engage with feed holes 25b, it is possible to regulate movement of tape body 25a by first fixation claw 56 and second fixation claw 60 and the position of tape body 25a is fixed, as long as an external force does not act on tape body 25a in the tape feed direction (arrow g).

Next, a tape feed operation by tape feed mechanism 31 will be described with reference to FIGS. 8A, 8B, 8C, and 8D. The drawings illustrate views of a structure of main parts, viewed from above. First, FIG. 8A illustrates a state in which all of first feed claw 54 of first feed member 50, first feed claw 56 of first fixation member 52, second feed claw 58 of second feed member 51, and second feed claw 60 of second fixation member 53 engage with feed holes 25b and tape body 25a is stopped.

Next, FIG. 8B illustrates a state in which tape-feed driving cylinder 32 illustrated in FIG. 7B is driven such that moving member 39 is caused to move in the tape feed direction (arrow g). In this state, both first feed member 50 and second feed member 51 move (arrows i and j) along with moving member 39, thereby an external force acts in the tape feed direction on tape body 25a through first feed claw 54 and second feed claw 58 which engage with feed holes 25b, and the tape feeding (arrow k) of tape body 25a is performed. At this time, first fixation claw 56 and second fixation claw 60 are separated from feed holes 25b against bias forces of third spring member 57 and fourth spring member 61, thereby not interfering with the movement of tape body 25a.

FIG. 8C illustrates a state in which moving member 39 moves by the predetermined amount corresponding to one pitch of feed holes 25b. In other words, in this state, the tape feeding of tape body 25a is performed by one pitch, thereby, first fixation claw 56 of first fixation member 52 and second fixation claw 60 of second fixation member 53 move by one pitch and engage with next feed holes 25b, respectively, and thereby, the position of tape body 25a is fixed.

Subsequently, a returning operation of moving member 39 by the predetermined amount corresponding to one pitch is performed. In this manner, as illustrated in FIG. 8D, first feed member 50 and second feed member 51 move in the returning directions, respectively (arrows l and m). At this time, since the position of tape body 25a is fixed by first fixation member 52 and second fixation member 53, first feed claw 54 and second feed claw 58 are separated from feed holes 25b against the bias forces of first spring member 55 and second spring member 59 when first feed member 50 and second feed member 51 move in the returning direction, thereby not interfering with the movement of first feed member 50 and second feed member 51. Also, moving member 39 moves in the returning direction by the predetermined amount corresponding to one pitch, and thereby first feed claw 54 and second feed claw 58 engage with feed holes 25b and return to the state illustrated in FIG. 8A. In this manner, a tape feeding operation by one pitch by tape feed mechanism 31 is completed.

Figure 9A:
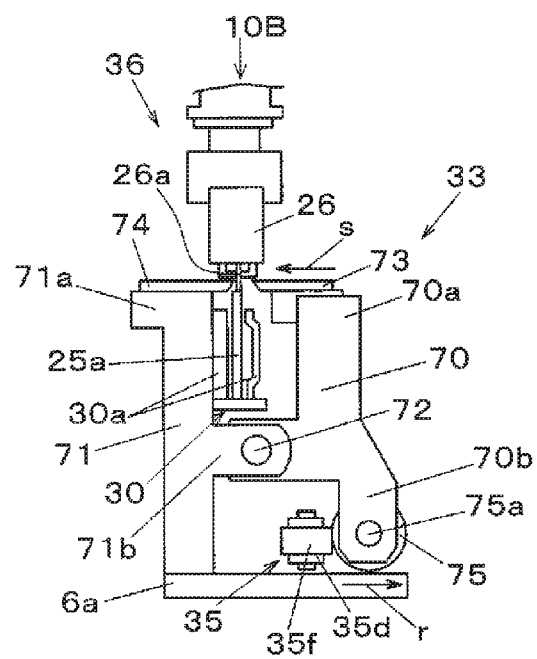
FIG. 9A is an explanatory view of a configuration of a lead cutting mechanism in the radial component feeder which is installed in the electronic component mounter of the embodiment of the present invention.
Figure 9B:
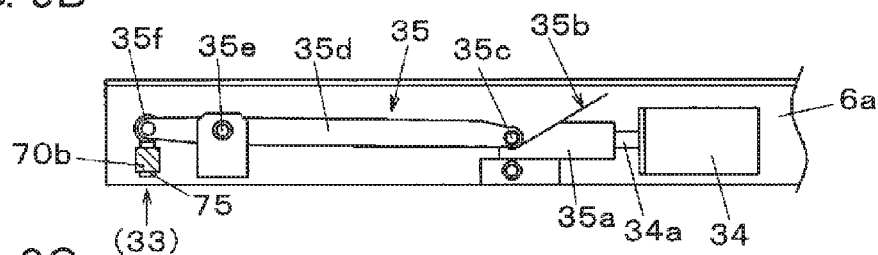
FIG. 9B is a view of a process in a structure of a main part of a drive transmitting mechanism in FIG. 9A, viewed from above.

Next, configurations of lead cutting mechanism 33, which cuts lead 26a of radial lead type electronic component 26 at supply position 36, is described with reference to FIGS. 9A, 9B, and 9C. FIG. 9A illustrates a sectional view of lead cutting mechanism 33 in the vicinity of supply position 36. In FIG. 9A, fixation frame member 71 is provided to be upright on the top surface of a base of feeder body portion 6a, and movable cutting member 70 pivots around pivot 72 at hinge 71b provided to extend from fixation frame member 71 to the center side.

Tape transporter 30 extends above pivot 72 and between movable cutting member 70 and fixation frame member 71. Tape body 25a, in which lead 26a of radial lead type electronic components 26 are taped, is held in the vertical posture between guide members 30a of tape transporter 30. Movable blade 73 and fixed blade 74, which pinch and cut lead 26a of radial lead type electronic component 26 held by mounting head 10B, are installed on apex 70a of movable cutting member 70 and apex 71a of fixation frame member 71.

Roller member 75 pivots around pivot 75a in lower portion 70b below pivot 72 in movable cutting member 70. As will be described below, roller member 75 is driven by lead cutting cylinder 34 through drive transmitting mechanism 35 in a horizontally outward direction (arrow r). In this manner, apex 70a pivots around pivot 72, and movable blade 73 installed on apex 70a moves in a direction (arrow s) in which lead 26a is pinched between the movable blade and fixed blade 74 and is cut.

Configurations and functions of drive transmitting mechanism 35 will be described with reference to FIGS. 9B and 9C. FIGS. 9B and 9C are views of a structure of main parts of drive transmitting mechanism 35 in FIG. 9A, viewed from above. As illustrated in FIG. 9B, substantially wedge-shaped moving cam member 35a having tapered surface 35b is joined to rod 34a of lead cutting cylinder 34. Cam follower 35c installed on an end portion on one side of arm member 35d, which extends to lead cutting mechanism 33 in feeder body portion 6a, abuts on tapered surface 35b. Arm member 35d pivots around pivot 35e at a position adjacent to lead cutting mechanism 33 so as to pivot freely within a flat plane. Cam follower 35f is installed on the end portion on the other side of arm member 35d at a position at which the cam follower abuts on roller member 75 (also refer to FIG. 9A).

Figure 9C:
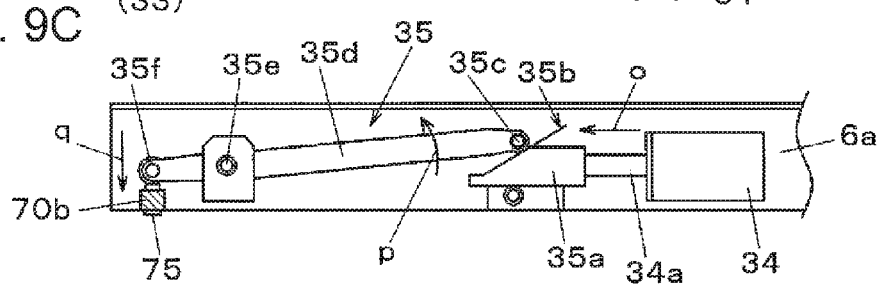
FIG. 9C is a view of another process in the structure of the main part of the drive transmitting mechanism in FIG. 9A, viewed from above.

As illustrated in FIG. 9C, lead cutting cylinder 34 is driven in a projecting direction (arrow o) of rod 34a, and thereby moving cam member 35a also moves. Also, cam follower 35c moves along tapered surface 35b, and thereby arm member 35d pivots around pivot 35e within a flat plane according to the displacement amount by tapered surface 35b in a transverse direction (arrow p). Pivoting of arm member 35d causes cam follower 35f installed on the end portion of the other side of the arm member to move in a horizontally outward direction (arrow q). In this manner, as illustrated in FIG. 9A, roller member 75 abutting on cam follower 35f moves in a horizontally outward direction (arrow r) and pinching and cutting of lead 26a described above are performed.

Figure 10A:
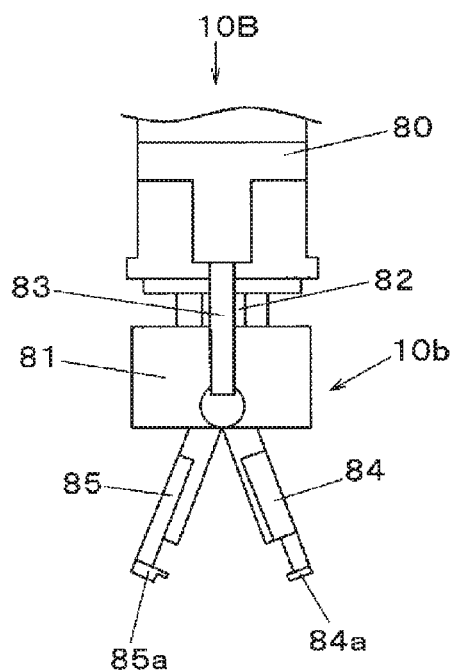
FIG. 10A is an explanatory view of a configuration of a chuck unit which performs chucking and holds a radial lead type electronic component in the electronic component mounter of the embodiment of the present invention.

Next, configurations of mounting head 10B having a function of holding radial lead type electronic component 26 will be described with reference to FIGS. 10A, 10B, and 10C. As illustrated in FIG. 10A, chuck unit 10b, which holds radial lead type electronic component 26 by chucking, is installed in a lower end portion of mounting head 10B. Chuck unit 10b includes first chuck arm 84 and second chuck arm 85 which are driven to be opened and closed by chuck opening-closing mechanism 81, and first chuck arm 84 and second chuck arm 85 are driven in a closing direction. In this manner, grabs 84a and 85a provided in the lower end portion of first chuck arm 84 and second chuck arm 85, respectively, pinch and hold lead 26a of radial lead type electronic component 26.

Chuck opening-closing mechanism 81 is operated by chuck drive shaft 82 which is driven by a built-in chuck drive source in mounting head 10B, and chuck drive shaft 82 is lowered. In this manner, a closing operation of first chuck arm 84 and second chuck arm 85 is performed. In addition, mounting head 10B includes pusher drive shaft 83 for pushing, into an insertion hole in the board, lead 26a of radial lead type electronic component 26 held by first chuck arm 84 and second chuck arm 85. Pusher drive shaft 83 is driven by a built-in pusher drive source in mounting head 10B and performs a lifting and lowering operation.

Configurations and operations of chuck opening-closing mechanism 81 will be described with reference to FIGS. 10B and 10C. As illustrated in FIG. 10B, first chuck arm 84 and second chuck arm 85 are pivoted by hinge mechanism 88 and are allowed to pivot around hinge mechanism 88. First chuck arm 84 and second chuck arm 85 are L-shaped members having opening-closing motioning portions 84b and 85b which extend outward in a substantially right angle direction from hinge mechanism 88, and cam followers 84c and 85c are installed in opening-closing motioning portions 84b and 85b, respectively.

Chuck opening-closing mechanism 81 includes opening-closing drive member 86 which is joined to chuck drive shaft 82 and is lifted and lowered, and fitting portion 86b, in which cam follower 85c is fitted, is formed in drive transmitter 86a extending from a side surface on one side of opening-closing drive member 86. In addition, transmission member 87 having the same shape as drive transmitter 86a is fixed to the side surface on the one side of opening-closing drive member 86, and cam follower 84c is fitted in fitting portion 87a formed in transmission member 87. FIG. 10B illustrates a state in which opening-closing drive member 86 is lifted by chuck drive shaft 82. In this state, opening-closing motioning portions 84b and 85b are pulled up to positions and thus, first chuck arm 84 and second chuck arm 85 are in an opened state.

Figure 10B:
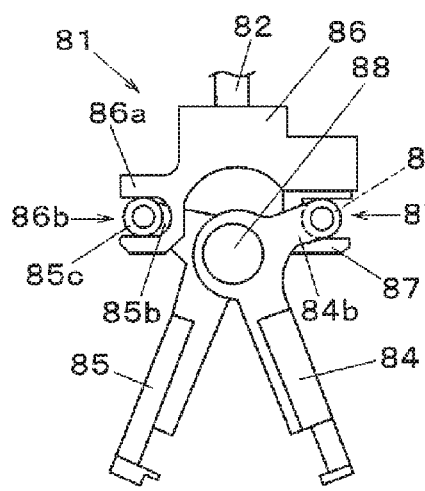
FIG. 10B is a view illustrating an open state of a chuck opening-closing mechanism in FIG. 10A.
Figure 10C:
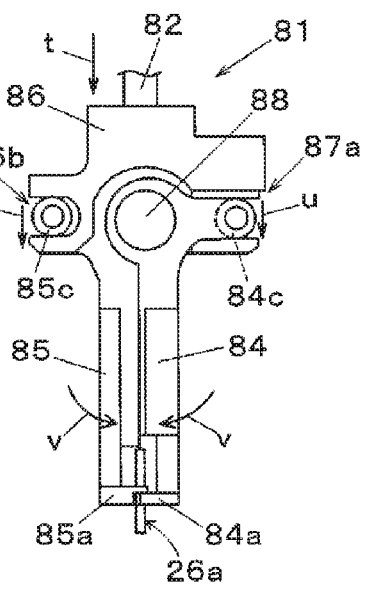
FIG. 10C is a view illustrating a closed state of a chuck opening-closing mechanism in FIG. 10B.

FIG. 10C illustrates a state in which chuck drive shaft 82 is driven in a lowering direction (arrow t) from the state illustrated in FIG. 10B, and opening-closing drive member 86 is lowered. Cam followers 84c and 85c which are fitted in fitting portions 87a and 86b, respectively, are lowered (arrow u) along with a downward displacement of opening-closing drive member 86, and thereby a closing operation of first chuck arm 84 and second chuck arm 85 is performed (arrow v). Also, in this state, it is possible to pinch and hold lead 26*a* of radial lead type electronic component 26 by grabs 84*a* and 85*a* provided in the lower end portions of first chuck arm 84 and second chuck arm 85.

Next, a series of operations of holding and picking up radial lead type electronic component 26 and mounting the component on board 3 by mounting head 10B will be described with reference to FIGS. 11A, 11B, 11C, 12A, 12B, and 12C. First, FIG. 11A illustrates a state in which mounting head 10B is caused to move above radial component feeder 6 as a component picked-up target, and is positioned above supply position 36 of corresponding radial component feeder 6. At this time, radial lead type electronic component 26 having lead 26*a* taped in tape body 25*a* is held at supply position 36 in the upright posture. Also, in mounting head 10B, chuck drive shaft 82 which drives chuck opening-closing mechanism 81 is placed at a lifted position, first chuck arm 84 and second chuck arm 85 are in the opening state, and pusher drive shaft 83 is placed at a lifted position.

Subsequently, as illustrated in FIG. 11B, mounting head 10B is lowered (arrow w) such that it is possible to perform chucking of radial lead type electronic component 26 by first chuck arm 84 and second chuck arm 85. Also, as illustrated in FIG. 11C, chuck drive shaft 82 is lowered so as to drive chuck opening-closing mechanism 81, and the closing operation of first chuck arm 84 and second chuck arm 85 is performed. In this manner, lead 26*a* of radial lead type electronic component 26 is pinched by grabs 84*a* and 85*a* provided in the lower end portions of first chuck arm 84 and second chuck arm 85. Also, lead 26*a* is cut in this state by lead cutting mechanism 33 illustrated in FIGS. 9A to 9C. In this manner, radial lead type electronic component 26 is in a state of being separated from tape body 25*a* and of being held by mounting head 10B, and the operation proceeds to a component mounting operation on board 3.

In other words, mounting head 10B holding radial lead type electronic components 26 is caused to move above board 3 and, as illustrated in FIG. 12A, mounting head 10B is lowered (arrow x) while lead 26*a* is positioned into insertion hole 3*a* as a mounted target. Also, chuck drive shaft 82 drives chuck opening-closing mechanism 81 in such a lowering operation. In this manner, as illustrated in FIG. 12B, first chuck arm 84 and second chuck arm 85 are in the opening state so as to release the pinching of lead 26*a*, and pusher drive shaft 83 is lowered (arrow y) so as to press radial lead type electronic component 26 from the top surface side of the component, thereby pushing lead 26*a* into insertion hole 3*a*. In this manner, the mounting of one radial lead type electronic component 26 on board 3 is completed and, as illustrated in FIG. 12C, mounting head 10B is lifted from board 3 (arrow z) after the completion of the mounting operation, and the operation proceeds to the next component mounting operation.

As described above, in the present embodiment, electronic component mounter 1 includes supplier holders 4A and 4B in which a plurality of electronic component suppliers such as tape feeders 5 or radial component feeders 6 can be installed, and has a configuration in which mounting head 10B holds radial lead type electronic component 26 and mounts the component on board 3 positioned in board transporter 2. The electronic component mounter further includes tape guide passage 4*b* which guides tape body 25*a* after radial lead type electronic components 26 are picked up from the tape body 25*a*. Further, radial component feeder 6 is configured to have posture converter 37 that converts the posture of tape body 25*a* from the vertical posture with respect to the flat surface into the posture parallel to the flat surface, and that guides the tape body 25*a* to tape guide passage 4*b*, after radial lead type electronic components 26 are picked up from the tape body 25*a*. According to such a configuration, it is possible to dispose of the tape in a simple configuration after the separation of the electronic components without feeding tape body 25*a* in the returning direction after radial lead type electronic components 26 are separated from the tape body 25*a*.

An electronic component mounter of the present invention has an effect that, with the radial lead type electronic component as a mounting target, it is possible to dispose of the tape in a simple configuration after the electronic components are separated from the tape, and is applicable in a component mounting field in which a mounting target includes a radial lead type electronic component.

What is claimed is:

1. An electronic component mounter comprising:
   a board transporter that transports a board and positions the board at a predetermined position;
   a supplier holder in which one or more electronic component suppliers supplying an electronic component can be installed;
   a radial lead type electronic component supplier which is installed in the supplier holder, in which an electronic component holding tape having a plurality of radial lead type electronic components and a tape body holding the plurality of radial lead type electronic components is loaded, and which supplies, in order, the radial lead type electronic components to a supply position;
   a mounting head that holds the radial lead type electronic components and mounts the radial lead type electronic components on the board positioned by the board transporter; and
   a tape guide passage that guides the tape body after the radial lead type electronic components are picked up from the tape body,
   wherein the radial lead type electronic component supplier includes a posture converter that converts a posture of the tape body from a posture perpendicular to a horizontal plane to a posture parallel to the horizontal plane, after the radial lead type electronic components are picked up from the tape body, and that introduces the tape body to the tape guide passage.

2. The electronic component mounter of claim 1, further comprising:
   a tape cutter that cuts the tape body after the radial lead type electronic components are picked up from the tape body,
   wherein the tape guide passage guides the tape body to the tape cutter.

3. The electronic component mounter of claim 2,
   wherein the posture converter is closer to a tape guide passage side than a supply position side.

4. The electronic component mounter of claim 3, further comprising:
   a chip type electronic component supplier which is installed in the supplier holder, in which an electronic component holding tape having a plurality of chip type electronic components and a tape body holding the plurality of chip type electronic components is loaded, and which supplies, in order, the chip type electronic components to a supply position,
   wherein the tape cutter collectively cuts the tape body that held the radial lead type electronic components and the tape body that held the chip type electronic components, introduced to the tape guide passage.

5. The electronic component mounter of claim 2, further comprising:
- a chip type electronic component supplier which is installed in the supplier holder, in which an electronic component holding tape having a plurality of chip type electronic components and a tape body holding the plurality of chip type electronic components is loaded, and which supplies, in order, the chip type electronic components to a supply position,
- wherein the tape cutter collectively cuts the tape body that held the radial lead type electronic components and the tape body that held the chip type electronic components, introduced to the tape guide passage.

6. The electronic component mounter of claim 1,
- wherein the posture converter is closer to a tape guide passage side than a supply position side.

7. The electronic component mounter of claim 6, further comprising:
- a chip type electronic component supplier which is installed in the supplier holder, in which an electronic component holding tape having a plurality of chip type electronic components and a tape body holding the plurality of chip type electronic components is loaded, and which supplies, in order, the chip type electronic components to a supply position,
- wherein the tape cutter collectively cuts the tape body that held the radial lead type electronic components and the tape body that held the chip type electronic components, introduced to the tape guide passage.

\* \* \* \* \*